United States Patent
Mankala et al.

(10) Patent No.: US 9,136,751 B2
(45) Date of Patent: Sep. 15, 2015

(54) LINEAR MOTOR MAGNETIC SHIELD APPARATUS FOR LITHOGRAPHIC SYSTEMS

(75) Inventors: Kalyan Kumar Mankala, Hamden, CT (US); Roberto Bernardo Wiener, Ridgefield, CT (US); Pradeep Kumar Govil, Norwalk, CT (US); Andrew Nelson, Bettendof, IA (US)

(73) Assignee: ASML Holding N.V., Veldhoven (NL)

(*) Notice: Subject to any disclaimer, the term of this patent is extended or adjusted under 35 U.S.C. 154(b) by 22 days.

(21) Appl. No.: 13/617,543

(22) Filed: Sep. 14, 2012

(65) Prior Publication Data

US 2013/0010273 A1    Jan. 10, 2013

Related U.S. Application Data

(62) Division of application No. 12/622,665, filed on Nov. 20, 2009.

(60) Provisional application No. 61/141,863, filed on Dec. 31, 2008.

(51) Int. Cl.
*H02K 41/03* (2006.01)
*H02K 11/00* (2006.01)

(52) U.S. Cl.
CPC ............ *H02K 41/03* (2013.01); *H02K 11/0005* (2013.01); *H02K 2201/18* (2013.01)

(58) Field of Classification Search
CPC .................................................. H02K 11/0005
USPC ................................ 355/72; 310/12.01, 12.06
See application file for complete search history.

(56) References Cited

U.S. PATENT DOCUMENTS

| | | | |
|---|---|---|---|
| 6,043,572 | A | 3/2000 | Nagai et al. |
| 6,639,225 | B2 | 10/2003 | Kirschstein et al. |
| 6,717,296 | B2 | 4/2004 | Hol et al. |
| 6,730,916 | B1 | 5/2004 | Tsuji et al. |
| 6,750,571 | B2 | 6/2004 | Tominaga et al. |
| 7,005,823 | B2 | 2/2006 | Houkes et al. |

(Continued)

FOREIGN PATENT DOCUMENTS

| | | |
|---|---|---|
| JP | 56-088666 A | 7/1981 |
| JP | 2001-126651 A | 5/2001 |

(Continued)

OTHER PUBLICATIONS

English-Language Abstract of Japanese Patent Publication No. 2003-037047 A, published Feb. 7, 2003; 1 page.

(Continued)

*Primary Examiner* — Chia-How Michael Liu
(74) *Attorney, Agent, or Firm* — Sterne, Kessler, Goldstein & Fox P.L.L.C.

(57) ABSTRACT

A magnetic shield having non-magnetic gaps provides reduced magnetic cross-talk for a linear motor array in a precision positioning system. Redirecting the leakage flux limits the cross-talk and associated deleterious effects. Such preferred magnetic circuit paths for the leakage are affixed to the moving magnet system of the linear motor. Embodiments of the preferred flux leakage paths are realized by providing a ferromagnetic shield separated by a non-magnetic gap between the permanent magnets and the back-irons. In another embodiment, the ferromagnetic shield separation includes diamagnetic materials.

24 Claims, 9 Drawing Sheets

(56) References Cited

U.S. PATENT DOCUMENTS

| | | |
|---|---|---|
| 7,145,269 B2 | 12/2006 | Hol et al. |
| 7,348,752 B1 | 3/2008 | Butler |
| 7,541,699 B2 | 6/2009 | Dams |
| 7,825,548 B2 | 11/2010 | Maemura et al. |
| 2010/0165311 A1 | 7/2010 | Mankala et al. |

FOREIGN PATENT DOCUMENTS

| | | |
|---|---|---|
| JP | 2003-037047 A | 2/2003 |
| JP | 2003-088088 A | 3/2003 |
| JP | 2003-158865 A | 5/2003 |
| JP | 2003-244927 A | 8/2003 |
| JP | 2005-129941 A | 5/2005 |
| JP | 2005-260234 A | 9/2005 |
| JP | 2007-251128 A | 9/2007 |
| JP | 2008-141165 A | 6/2008 |
| TW | I307994 B | 3/2009 |

OTHER PUBLICATIONS

English-Language Abstract of Japanese Patent Publication No. 2003-244927 A, published Aug. 29, 2003; 1 page.

English-Language Translation of Korean Notification of Reasons for Refusal directed to related Korean Patent Application No. 10-2009-0134068, mailed Mar. 22, 2011; 3 pages.

English-Language Translation of Notice of Reasons for Rejection directed to related Japanese Patent Application No. 2009-283553, mailed May 25, 2012, from the Japanese Patent Office; 3 pages.

English-Language Abstract for Japanese Patent Publication No. 2003-088088 A, published Mar. 20, 2003; 1 page.

Non-Final Rejection mailed Aug. 15, 2012 for U.S. Appl. No. 12/622,665, filed Nov. 20, 2009; 8 pages.

Final Rejection mailed Nov. 23, 2012 for U.S. Appl. No. 12/622,665, filed Nov. 20, 2009; 12 pages.

LINEAR MOTOR MAGNETIC SHIELD APPARATUS FOR LITHOGRAPHIC SYSTEMS

CROSS REFERENCE TO RELATED APPLICATIONS

This application is a divisional of U.S. Non-Provisional application of Ser. No. 12/622,665, filed Nov. 20, 2009, which claims benefit under 35 U.S.C. §119(e) to U.S. Provisional Application No. 61/141,863, filed Dec. 31, 2008, which is incorporated by reference herein in its entirety.

BACKGROUND

1. Field

Embodiments of the present invention relate to a linear motor, and in particular to a linear motor used in precision drive applications such as semiconductor lithography.

2. Background

Many automated manufacturing processes require the ability to move a workpiece quickly and accurately into a location at which one or more process steps are performed. In some applications, such as semiconductor lithography, such precision positioning must be achieved with an accuracy approaching nanometers, and with speeds consistent with the throughput requirements of modern day lithographic processes.

The challenges associated with positioning equipment to accuracies of the order of nanometers are significant, particularly in the context of photolithography systems. In the photolithography context, substrates undergo multiple processes that result in a modern day integrated circuit. Many of these processes require that multiple steps be performed on a substrate, where each step requires excruciating alignment from one step to a successive step. Many of these steps require the substrate to be moved into and out of one or more stages for patterning and other operations. Not only are nanometer alignments a significant challenge but the throughput of modern day lithographic systems demands rapid movement to and from those precise locations. Moreover, many lithographic systems contain two or more tables such that preparatory steps can be accomplished in parallel with the main processing steps. The use of multiple tables requires expeditious re-positioning of the substrate in order to capitalize on the benefit of the multiple tables.

Linear motors have become a preferred means of positioning in lithography by virtue of their accuracy, acceleration, travel range, packaging size, improved power dissipation, reliability and longevity. In many lithographic applications, arrays of linear motors are used to maximize the actuator force while meeting volume and other requirements of modern lithographic equipment.

A linear motor typically includes of a magnetic circuit having permanent magnets, a back-iron and a coil. When the coil is energized, an electromagnetic interaction between the energized coil and the permanent magnets generates the actuator force used for the precision positioning.

However, some amount of magnetic flux leaks out of the intended magnetic circuit of the linear motor. Because of the proximity of adjacent linear motors, the leakage flux travels through the alternate low resistance path offered by the permanent magnets and ferromagnetic materials within the adjacent linear motors. Such a path for the leakage flux results in undesirable cross-talk forces acting in conflict with the desired forces produced by the linear motors.

Specifically, these cross-talk forces pose the following significant concerns to the use of a linear motor in a precision positioning system. Firstly, a fraction of the nominally available motor force is lost in overcoming cross-talk resistance in the driving direction, which results in increased power dissipation. Secondly, the cross-talk resistance in the driving direction varies with the distance between adjacent linear motors or adjacent ferromagnetic materials. Such variation poses significant challenges to the control system of the linear motor, with potentially unstable consequences. Finally, a cross-talk force component in the lateral direction (i.e., lateral to the driving direction) results in undesired physical forces being applied to the frame to which the linear motors are mounted. The level of such forces can be significant enough to result in deformation to the frame. For example, in a given configuration, a lateral cross-talk force of 0.1 N can result in magnet frame deformations of the order of 20 μm. Such deformations result in significant challenges to linear motor design for position systems that already must account for packaging efficiency, manufacturing tolerances, alignment tolerances and a design safety factor.

Therefore, what is needed is a linear motor that can minimize the impact of magnetic leakage flux, while maintaining the benefits of accurate positioning and rapid acceleration so necessary to meet the modern semiconductor lithography demands.

BRIEF SUMMARY

In one embodiment of the present invention, a linear motor is provided that reduces magnetic flux leakage by using a low reluctance shield in close proximity, but separated from, the permanent magnets and back-irons in the magnetic circuit.

In various embodiments of the present invention, the separation of the shield is provided by air, vacuum, epoxy, diamagnetic materials, and/or high reluctance materials.

In further embodiments of the present invention, configurations of the shield provide varying degrees of stray magnetic flux interception and redirection.

In a further embodiment of the present invention, a multi-piece shield includes a shield that acts to redirect stray magnetic flux in the direction of travel and is connected to the components of the magnetic circuit, and a shield that acts to redirect stray magnetic flux in a direction lateral to the direction of travel is stationary.

Further embodiments, features, and advantages of the invention, as well as the structure and operation of the various embodiments of the invention are described in detail below with reference to the accompanying drawings.

BRIEF DESCRIPTION OF THE DRAWINGS/FIGURES

Embodiments of the present invention are described with reference to the accompanying drawings. In the drawings, like reference numbers indicate identical or functionally similar elements.

FIGS. 1A and 1B respectively depict reflective and transmissive lithographic apparatuses.

FIG. 2 provides a simulation of the exemplary leakage of magnetic flux in the magnetic circuits of two adjacent linear motors.

Figure 5A:
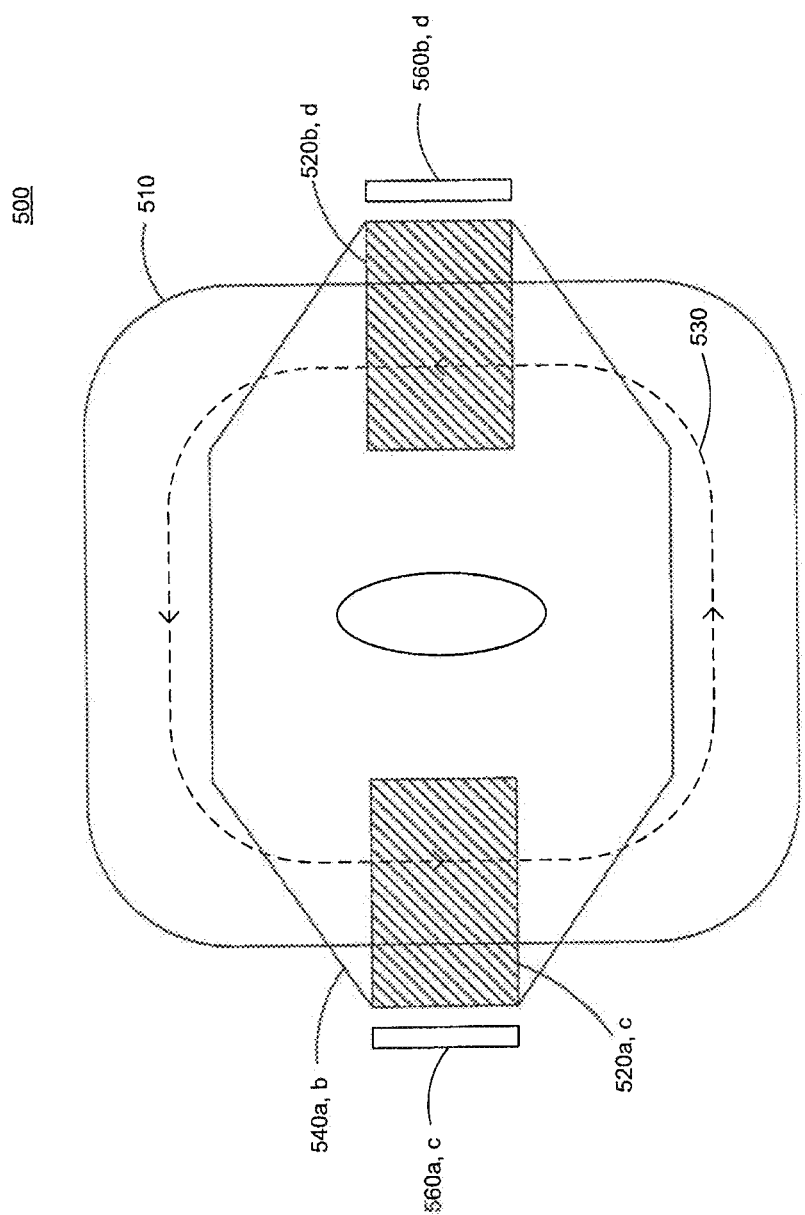
Figure 5B:
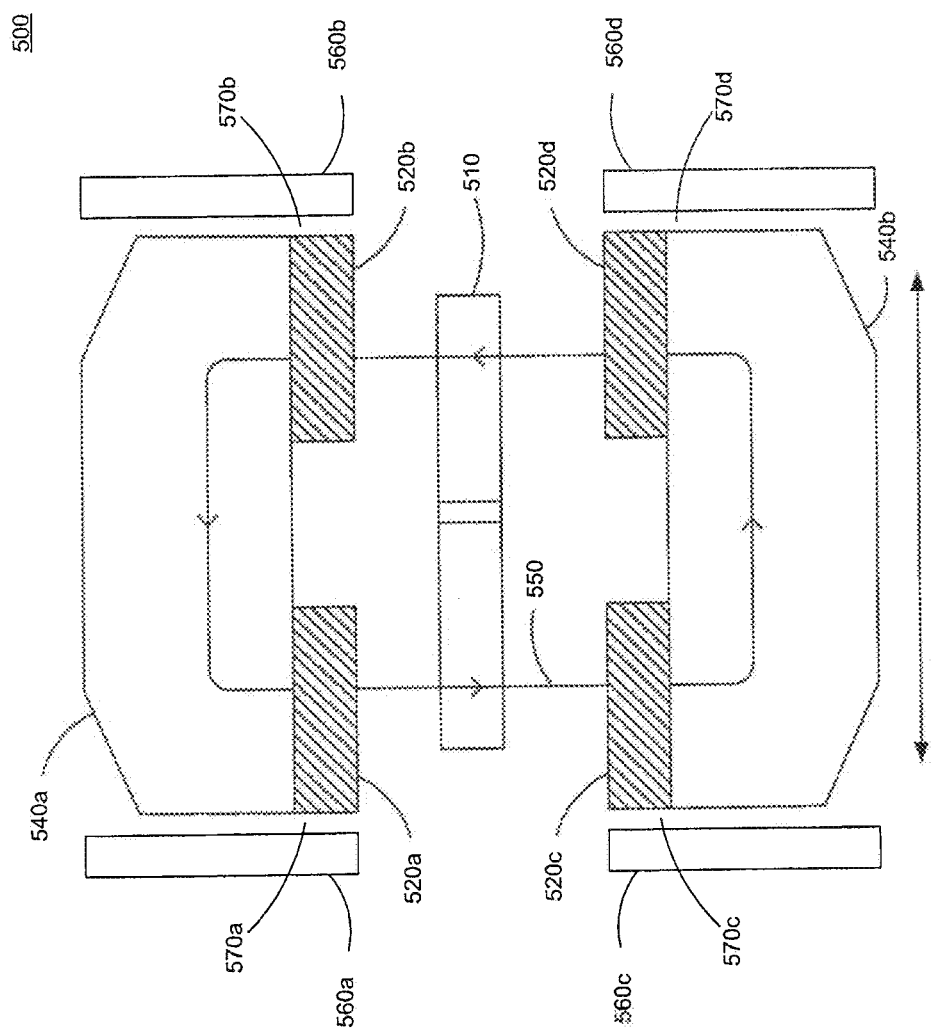

FIGS. 5A and 5B respectively provide a top view and a cross-sectional view of a linear motor with shield, in accordance with an embodiment of the present invention.

Figure 6:
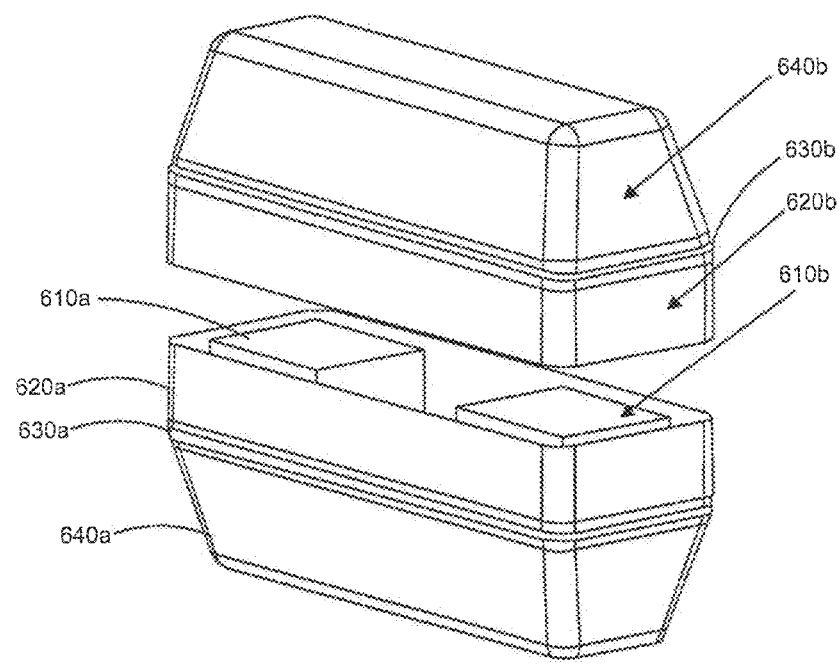

FIG. 6 illustrates another configuration of a shield, in accordance with an embodiment of the present invention.

Figure 7:
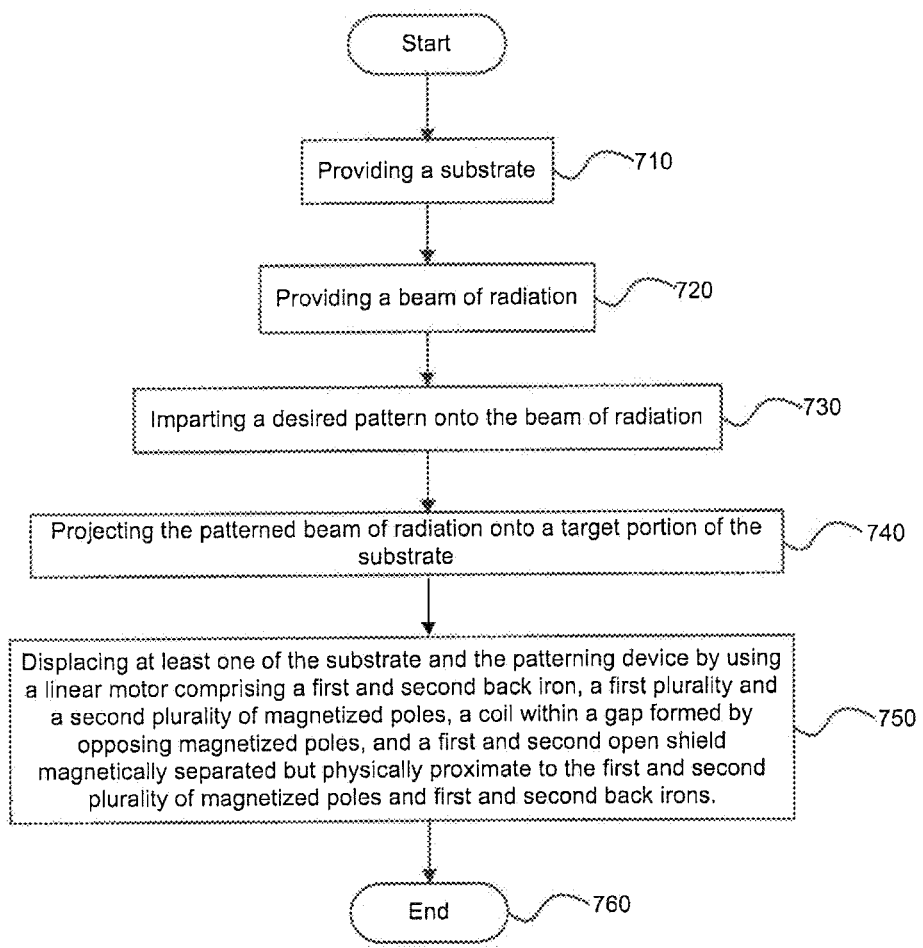

FIG. 7 provides a flowchart of a method to process a substrate, in accordance with an embodiment of the present invention.

DETAILED DESCRIPTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the present invention would be of significant utility.

Figure 1A:
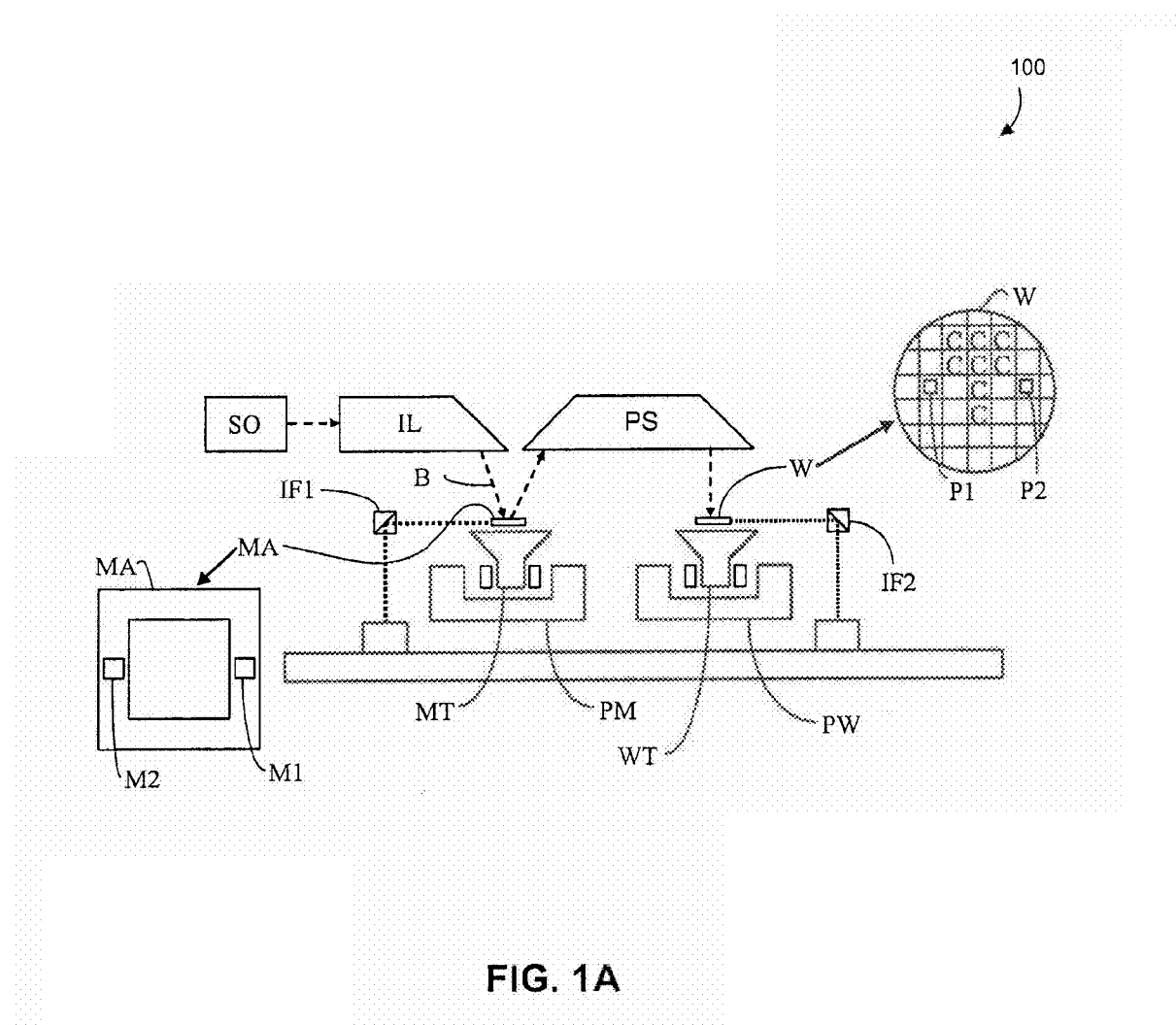
Figure 1B:
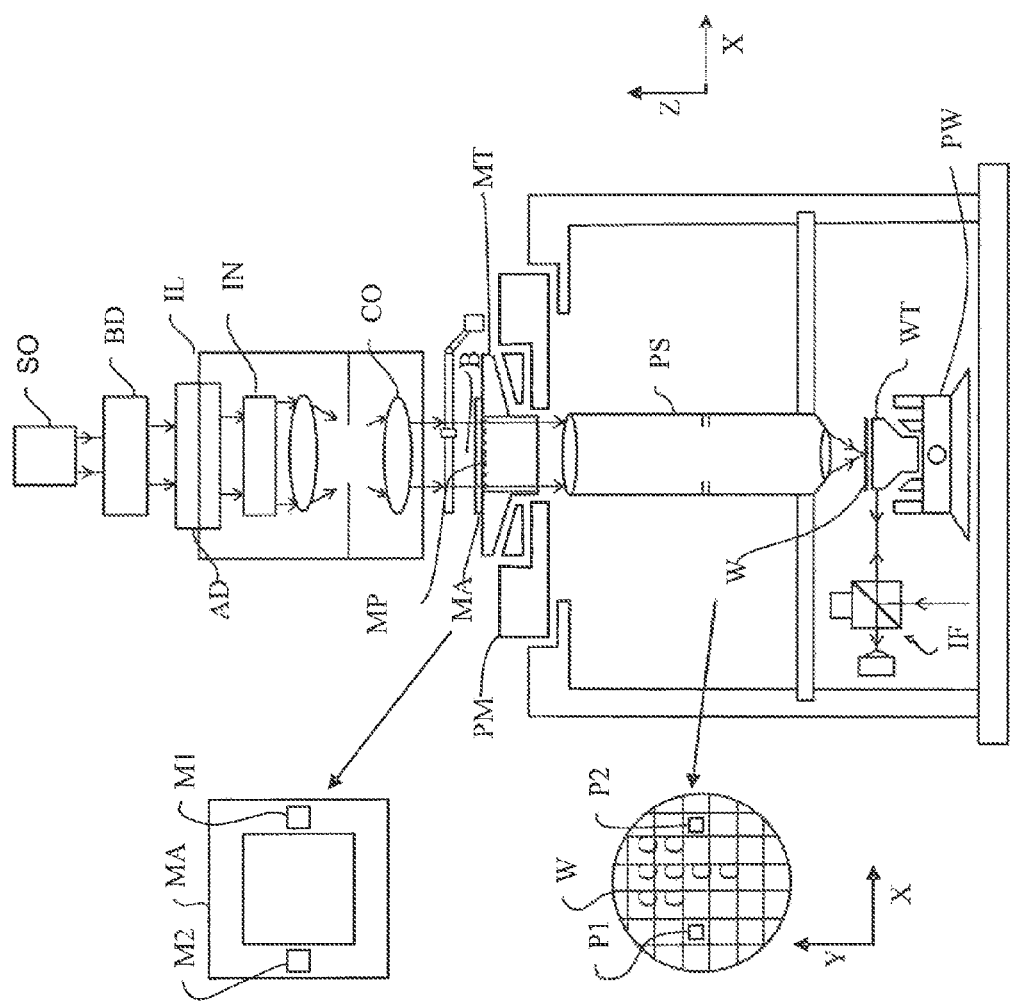

FIGS. 1A and 1B schematically depict lithographic apparatus 100 and lithographic apparatus 100', respectively. Lithographic apparatus 100 and lithographic apparatus 100' each include: an illumination system (illuminator) IL configured to condition a radiation beam B (e.g., DUV or EUV radiation); a support structure (e.g., a mask table) MT configured to support a patterning device (e.g., a mask, a reticle, or a dynamic patterning device) MA and connected to a first positioner PM configured to accurately position the patterning device MA; and a substrate table (e.g., a wafer table) WT configured to hold a substrate (e.g., a resist coated wafer) W and connected to a second positioner PW configured to accurately position the substrate W. Lithographic apparatuses 100 and 100' also have a projection system PS configured to project a pattern imparted to radiation beam B by patterning device MA onto a target portion (e.g., including one or more dies) C of the substrate W. In lithographic apparatus 100 patterning device MA and projection system PS are reflective, and in lithographic apparatus 100' patterning device MA and projection system PS are transmissive.

Illumination system IL may include various types of optical components, such as refractive, reflective, magnetic, electromagnetic, electrostatic or other types of optical components, or any combination thereof, for directing, shaping, or controlling the radiation B.

Support structure MT holds patterning device MA in a manner that depends on the orientation of patterning device MA, the design of lithographic apparatuses 100 and 100', and other conditions, such as for example whether or not patterning device MA is held in a vacuum environment. Support structure MT may use mechanical, vacuum, electrostatic or other clamping techniques to hold patterning device MA. Support structure MT may be a frame or a table, for example, which may be fixed or movable, as required. Support structure MT may ensure that the patterning device is at a desired position, for example with respect to projection system PS.

The term "patterning device" MA should be broadly interpreted as referring to any device that may be used to impart radiation beam B with a pattern in its cross-section, such as to create a pattern in target portion C of substrate W. The pattern imparted to radiation beam B may correspond to a particular functional layer in a device being created in target portion C, such as an integrated circuit.

Patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in radiation beam B which is reflected by the mirror matrix.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables (and/or two or more mask tables) WT. In such "multiple stage" machines the additional substrate tables WT may be used in parallel, or preparatory steps may be carried out on one or more tables while one or more other substrate tables WT are being used for exposure. When the preparatory steps can be performed while one or more other substrate tables WT are being used for exposure, the preparatory steps are said to occur during an "in-line phase" because the preparatory steps are performed within the desired throughput of lithographic apparatus 100 and/or lithographic apparatus 100'. In contrast, when the preparatory steps cannot be performed while one or more other substrate tables WT are being used for exposure, the preparatory steps are said to occur during an "off-line phase" because the preparatory steps cannot be performed within a desired throughput of lithographic apparatus 100 and/or lithographic apparatus 100'. As described in more detail herein, focus-positioning parameters of an exposure system (such as, for example projection system PS of lithographic apparatuses 100, 100') may be determined in an off-line phase, an in-line phase, or a combination thereof.

Referring to FIGS. 1A and 1B, illuminator IL receives a radiation beam from a radiation source SO. Source SO and the lithographic apparatuses 100, 100' may be separate entities, for example when source SO is an excimer laser. In such cases, source SO is not considered to form part of lithographic apparatuses 100 or 100', and radiation beam B passes from source SO to illuminator IL with the aid of a beam delivery system BD (FIG. 1B) including, for example, suitable directing mirrors and/or a beam expander. In other cases, source SO may be an integral part of lithographic apparatuses 100, 100' for example when source SO is a mercury lamp. Source SO and illuminator IL, together with beam delivery system BD, if required, may be referred to as a radiation system.

Illuminator IL may include an adjuster AD (FIG. 1B) for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, illuminator IL may include various other components (FIG. 1B), such as an integrator IN and a condenser CO. Illuminator IL may be used to condition radiation beam B, to have a desired uniformity and intensity distribution in its cross section.

Referring to FIG. 1A, radiation beam B is incident on patterning device (e.g., mask) MA having a mask pattern MP, which is held on support structure (e.g., mask table) MT, and is patterned by patterning device MA. In lithographic apparatus 100, radiation beam B is reflected from patterning device (e.g., mask) MA. After being reflected from the patterning device (e.g., mask) MA, radiation beam B passes through projection system PS, which focuses radiation beam B onto target portion C of substrate W. With the aid of the second positioner PW and position sensor IF2 (e.g., an interferometric device, linear encoder or capacitive sensor), substrate table WT may be moved accurately, e.g. so as to position different target portions C in the path of radiation beam B. Similarly, the first positioner PM and another position sensor IF1 may be used to accurately position patterning device (e.g., mask) MA with respect to the path of radiation beam B. Patterning device (e.g., mask) MA and substrate W may be aligned using mask alignment marks M1, M2 and substrate alignment marks P1, P2.

Referring to FIG. 1B, radiation beam B is incident on the patterning device (e.g., mask MA), which is held on the support structure (e.g., mask table MT), and is patterned by the patterning device. Having traversed mask MA, radiation beam B passes through projection system PS, which focuses the beam onto target portion C of substrate W. With the aid of the second positioner PW and position sensor IF (e.g., an interferometric device, linear encoder or capacitive sensor), substrate table WT can be moved accurately, e.g. so as to position different target portions C in the path of radiation beam B. Similarly, the first positioner PM and another position sensor (which is not explicitly depicted in FIG. 1B) can be used to accurately position mask MA with respect to the path of radiation beam B, e.g., after mechanical retrieval from a mask library, or during a scan.

In general, movement of mask table MT may be realized with the aid of a long-stroke module (coarse positioning) and a short-stroke module (fine positioning), which form part of the first positioner PM. Similarly, movement of substrate table WT may be realized using a long-stroke module and a short-stroke module, which form part of the second positioner PW. In the case of a stepper (as opposed to a scanner) mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (known as scribe-lane alignment marks). Similarly, in situations in which more than one die is provided on mask MA, the mask alignment marks may be located between the dies.

Lithographic apparatuses 100 and 100' may be used in at least one of the following modes.

In step mode, support structure (e.g., mask table) MT and substrate table WT are kept essentially stationary, while an entire pattern imparted to radiation beam B is projected onto target portion C at one time (i.e., a single static exposure). Substrate table WT is then shifted in the X and/or Y direction so that a different target portion C may be exposed.

In scan mode, support structure (e.g., mask table) MT and substrate table WT are scanned synchronously while a pattern imparted to radiation beam B is projected onto target portion C (i.e., a single dynamic exposure). The velocity and direction of substrate table WT relative to support structure (e.g., mask table) MT may be determined by the (de-)magnification and image reversal characteristics of projection system PS.

In another mode, support structure (e.g., mask table) MT is kept substantially stationary holding a programmable patterning device, and substrate table WT is moved or scanned while a pattern imparted to radiation beam B is projected onto target portion C. A pulsed radiation source SO may be employed and the programmable patterning device is updated as required after each movement of substrate table WT or in between successive radiation pulses during a scan. This mode of operation may be readily applied to maskless lithography that utilizes programmable patterning device, such as a programmable mirror array of a type as referred to herein.

Combinations and/or variations on the described modes of use or entirely different modes of use may also be employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 248, 193, 157 or 126 nm) or extreme ultraviolet radiation (e.g., having a wavelength of 5 nm or above).

The term "lens," where the context allows, may refer to any one or combination of various types of optical components, including refractive and reflective optical components.

Figure 2:
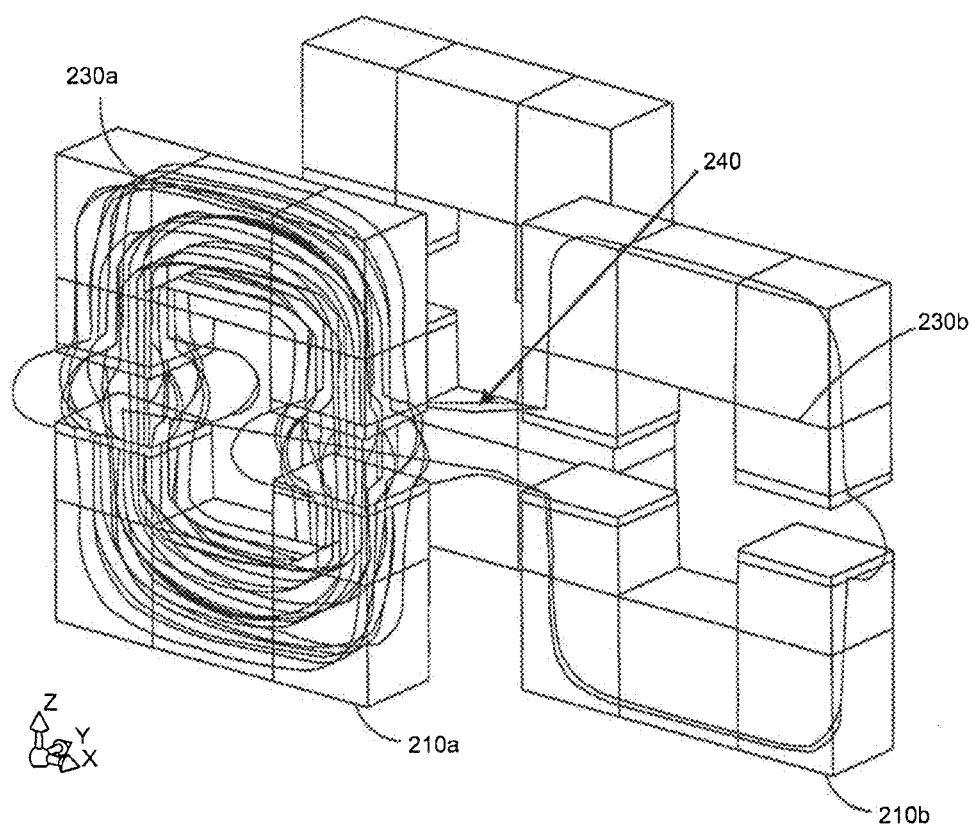

FIG. 2 provides a simulation of exemplary leakage of magnetic flux in the magnetic circuits of two adjacent linear motors 210a and 210b. In normal operation, the coil (not shown) in linear motor 210a is energized by current. The current in the coils interacts with the magnetic flux generated by the permanent magnets, which flows in the intended magnetic circuit 230a. The electrical current in the coil and the magnetic flux interact to generate a force perpendicular to both. This force, known as the Lorentz force, is proportional to the current in the coil. Notice that to a first order, the intensity of the magnetic flux, and therefore the cross-talk, is independent of the coil current. However, leakage flux 240 is flux that originates in intended magnetic circuit 230a, but closes via a portion of the adjacent magnetic circuit 230b of adjacent linear motor 210b. Such leakage flux 240 contributes to loss of motor force and increased power dissipation in linear motors 210a and 210b. Leakage flux 240 results in cross-talk forces with two components. A cross-talk force component in the driving direction of a linear motor poses a challenge to the stability of the control system for the linear motor, since such a cross-talk force component varies with distance between adjacent linear motors or adjacent ferromagnetic materials. A cross-talk force component in the lateral direction of a linear motor poses a risk of potential deformation of the frame to which the linear motor is mounted.

Figure 3:
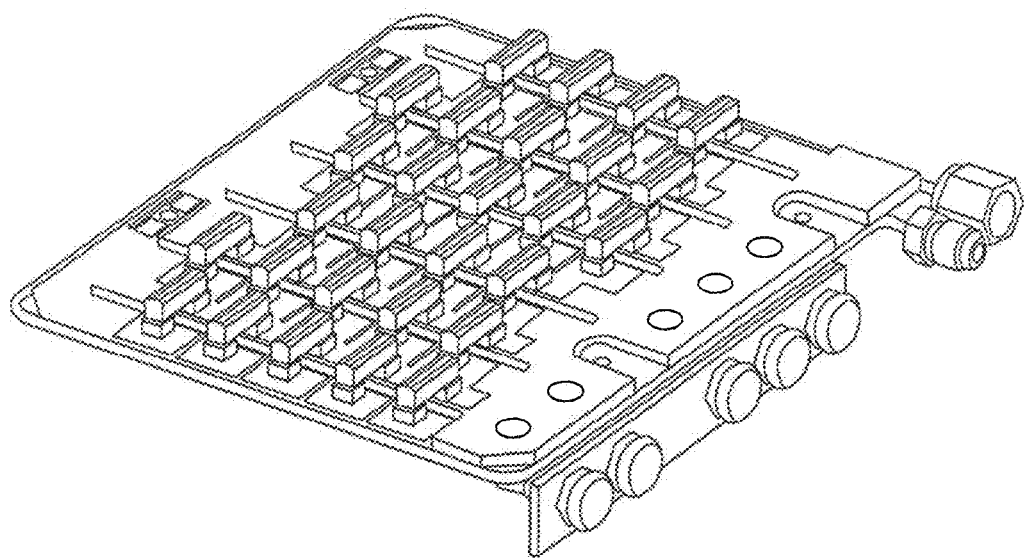
FIG. 3 illustrates a densely packed linear motor array configuration.

FIG. 3 illustrates the dilemma of proximity in a densely packed linear motor array configuration 300 that is commonly used in many precision positioning applications. Linear motor array configuration 300 shows a total of 28 linear motors arrayed in a 5, 5, 4, 5, 5, 4 configuration. Such close proximity as shown in FIG. 3 results in significant cross-talk forces that need to be addressed in order to provide a linear motor that addresses the challenges presented by modern day semiconductor lithography and comparable precision positioning applications. Note that the configuration shown in FIG. 3 is provided by way of example, and not by way of limitation. Those of ordinary skill in the relevant art(s) will recognize the wide variety of configurations of linear motors that fall within the scope of the teachings provided herein. Such configurations include but are not limited to rectangular, circular, oval, star, and octagonal arrays of linear motors.

Figure 4:
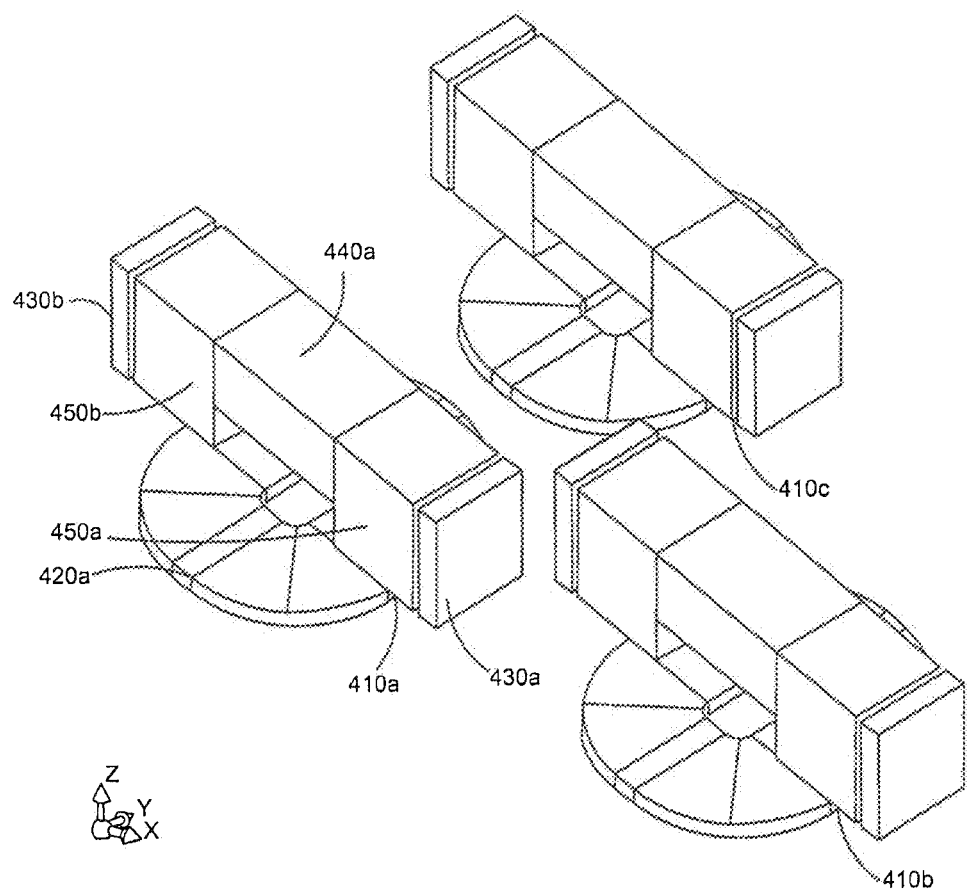
FIG. 4 illustrates a sketch of an array of three adjacent linear motors with shields, according to an embodiment of the present invention.

In various embodiments of the present invention, a shield is used to reduce the flux leakage problem described above. FIG. 4 illustrates an array 400 of three adjacent linear motors, 410a, 410b, and 410c, in accordance with an embodiment of the present invention. Only the symmetric upper half of each of these linear motors is shown. Not shown is an identical lower half of each of these linear motors. Components of linear motor 410a include a coil 420a, and a magnetic assembly including two shields 430a and 430b, a back iron 440a, and two permanent magnets 450a and 450b. Similar components exist for the other two linear motors 410b and 410c. The simplified illustration in FIG. 4 shows coils 420 to be planar coils that are sandwiched between mirror-image magnetic assemblies, namely an upper magnetic assembly (shown) and a lower magnetic assembly (not shown). Shields 430 are portrayed as simple blocks, although the shape of the shields may be any shape or configuration that is consistent with the requirements described below. In particular, shields 430a and 430b may each contain multi-piece blocks that form a desired shape or configuration.

Back irons 440 are made of ferromagnetic material, and are magnetically coupled to permanent magnets 450a, 450b to complete a magnetic flux circuit. Permanent magnets 450a, 450b of the linear motor include magnetized poles that are arranged in alternating polarity in the direction of travel of the linear motor. Between the upper symmetric half and lower symmetric half of the linear motors is a gap across which the magnetic flux crosses, and in which coil 420 is placed. The coil includes wire wound into a coil. In an embodiment of the coil, it can be a planar coil, a coil plate, a member of a group of separated individual coils (that may be coplanar with each other or located in different planes), or any other shape or configuration consistent with the physical space requirement. The coil can be of any thickness to meet other design requirements. For example, thicker coils typically lead to increased motor constants, but typically require a greater separation between the upper and lower motor portions. The greater the separation, the higher the risk of increased flux leakage. Note that the magnetic configuration shown in FIG. 4 is provided by way of example, and not by way of limitation. Specifically, other magnetic configurations fall within the scope of the teachings provided herein, including the use of Halbach arrays, the replacement of back iron 440 with a magnet, and rearranging the magnetic flux circuit by substituting back iron 440 with a permanent magnet and permanent magnet 450 with a back iron.

FIGS. 5A and 5B provide a top view and a cross-sectional view of a linear motor 500 respectively, in accordance with an embodiment of the present invention. Linear motor 500 includes a coil 510, located between two pairs of permanent magnets 520a, 520b and 520c, 520d. The two pairs of permanent magnets 520a, 520b, 520c, 520d are of alternating polarity. When energized, coil 510 has current flowing in the current path 530. A pair of back irons 540a, 540b are placed in contact with permanent magnets 520a, 520b, 520c, 520d to complete a magnetic circuit 550. Surrounding the permanent magnets 520a, 520b, 520c, 520d is a configuration of shields 560a, 560b, 560c, 560d. In an embodiment, linear motor 500 is a moving magnet design, in that permanent magnets 520a, 520b, 520c, 520d and back irons 540a, 540b move when coil 510 is energized, while coil 510 remains stationary.

Linear motor 500 also includes a magnetic shield 560. Its purpose is to minimize the leakage flux that flows out of the intended magnetic circuit and into one or more adjacent magnetic circuits. To be an effective shield, shield 560 should not interfere with the intended magnetic circuit. Rather, its focus is to redirect stray leakage flux away from adjacent linear motors. Based on these two objectives, redirection of the stray leakage flux may be achieved by making shield 560 from a low reluctance medium in the vicinity of the stray magnetic flux so as to redirect the stray magnetic flux away from the adjacent linear motors. Avoiding interference with the intended magnetic circuit can be achieved by ensuring a high reluctance medium exists between the intended magnetic circuit and shield 560. Accordingly, satisfactory reduction in the leakage flux can be achieved with an open shield, and thus does not require a complete Faraday shield. Note that a complete Faraday shield can be used, if needed due to stray flux paths. However, in reality, a Faraday shield can pose significant design challenges due to its additional weight and volume requirements. The following description provides a discussion of various aspects of shield 560. Such a discussion provides information by way of example, and not by way of limitation.

As noted above, shield 560 provides a low reluctance path for the stray leakage flux lines. Ferromagnetic materials exhibit low reluctance magnetic properties and are therefore suitable candidates for the material used in the manufacture of shield 560. Typical ferromagnetic materials include, but are not limited to, iron, cast iron, cast steel, magnetic stainless steel, carbon steel, and iron-nickel alloys. Persons skilled in the art will recognize that in various embodiments of the present invention shield 560 can include other materials such that the overall reluctance is lower than the "unshielded" path used by the stray magnetic flux.

Also, as noted above, shield 560 is separated from the intended magnetic circuit by a high reluctance medium. Such a separation is maintained between the shield and the permanent magnets, as well as between the shield and the back-irons. Suitable high reluctance media include, but are not limited to, air, vacuum, and any non-magnetic material. For example, in FIG. 5A/5B, shields 560a, 560b, 560c and 560d are separated from both permanent magnets 520a, 520b, 520c, 520d and back irons 540a, 540b by air gaps 570a, 570b, 570c, 570d. Non-magnetic epoxy, or any similar adhesive, can also be used to provide the high reluctance medium while maintaining the necessary physical separation.

Another alternative material capable of providing such a separation is a diamagnetic material. Diamagnetic materials present a greater reluctance than air for the stray magnetic flux lines to pass through. Diamagnetic materials possess a relative permeability that is less than 1, and are consequently deemed to "repel" magnetic flux. Present day diamagnetic materials such as Bismuth are characterized by a relative permeability of approximately 0.9998. However, future diamagnetic materials are expected to provide relative permeabilities that are less than 0.9, and would be additional candidates for providing the separation.

A particular thickness of the separation is not a requirement, but a thin separation often serves to reduce the volume and mass of the shield, while intercepting as many of the stray magnetic flux lines as possible.

Shield 560 may have a variety of different configurations. The shape of shield 560 is driven by the need to intercept as many stray magnetic flux lines as deemed appropriate to reduce stray magnetic flux problems to a desired level. Shield 560 is shaped so as to intercept these stray magnetic flux lines and redirect, as much as possible, the stray magnetic flux lines back towards the intended magnetic circuit. In an embodiment of the present invention illustrated in FIG. 5A/5B shield 560 is realized by an end-cap configuration. In such a configuration, an end-cap is placed at each end of the magnetic assembly in the travel direction of the linear motor. Simulations for such a configuration reveal that the use of these types of shields can reduce the cross-talk forces in the driving direction by approximately 68%, and can reduce the cross-talk forces in the lateral direction by approximately 80%. A minor reduction in the motor constant of approximately 1.8% may result from the use of this type of shield configuration in a particular embodiment of the present invention. Note that the values presented above are provided by way of example, and not by way of limitation. Those of skill in the relevant art(s) will recognize that a wide variety of design choices fall within the scope of the teachings provided herein.

FIG. 6 illustrates an exemplary linear motor 600 with another configuration of shield 620, in accordance with an embodiment of the present invention. In the lower magnetic assembly, shield 620a is shown wrapped around permanent magnets 610a, 610b, but separated from permanent magnets 610a, 610b by a suitable distance. Shield 620a is also separated from back-iron 640a by an epoxy 630a. A mirror-image upper magnetic assembly is also illustrated in FIG. 6. The upper magnetic assembly includes shield 620b wrapped around, but separated from, a pair of permanent magnets (not shown). Shield 620b is also separated from back-iron 640b by an epoxy 630b.

In both of the above configurations in FIGS. 5A/5B and 6, shields 560 and 620 are attached to the back-iron directly (or indirectly via a moving frame) so that shields 560 and 620 move along with the permanent magnets. In the configuration illustrated in FIG. 6, shield 620 includes a one-piece component for each half of the magnetic assembly. More generally, shield 620 can include a multi-piece construction (e.g., laminated construction) consistent with the above requirements.

In a further embodiment, the shield can include a two-part configuration for each of the upper magnetic circuit and the lower magnetic circuit, where one of the parts provides shielding in the lateral direction and the other part provides shielding in the travel direction. In an embodiment, the shields for the travel direction are attached to the back iron assembly in order to maintain the shielding effect during travel, while the shields in the lateral direction are not required to do so.

FIG. 7 provides a flowchart of an exemplary method 700 for processing a substrate using a linear motor with a shield to reduce flux leakage, according to an embodiment of the invention.

The process begins at step 710. In step 710, a substrate is provided. The substrate may be provided, for example, by substrate table WT, as illustrated in FIGS. 1A and 1B.

In step 720, a beam of radiation is provided. The beam of radiation may be provided, for example, by radiation source SO, as illustrated in FIGS. 1A and 1B.

In step 730, a desired pattern is imparted onto the beam of radiation. The desired pattern may be imparted onto the beam of radiation by, for example, patterning device MA, as illustrated in FIGS. 1A and 1B.

In step 740, the patterned beam of radiation is projected onto a target portion of the substrate. The patterned beam of radiation may be projected, for example, onto target portion C of substrate W, as illustrated in FIGS. 1A and 1B.

In step 750, at least one of the substrate and the patterning device is displaced by using a linear motor including a first and second back iron, a first plurality and a second plurality of magnetized poles, a coil within a gap formed by opposing magnetized poles, and a first and second open shield magnetically separated but physically proximate to the first and second plurality of magnetized poles and first and second back irons.

At step 760, method 700 ends.

Those skilled in the relevant art(s) will recognize that embodiments of the present invention are not limited to positioning of the substrate via substrate table WT and positioning of patterning device MA. Embodiments of the present invention further include, but are not limited to, positioning illuminator IL, components within illuminator IL such as adjuster AD and blocking members or attenuating members (also referred to as fingers) used to condition the illuminated beam of radiation, and optical elements (such as lenses and mirrors).

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A device manufacturing method, comprising:
projecting a patterned beam of radiation toward a substrate stage;
positioning the substrate stage using a linear motor, the linear motor comprising:
a first back iron and a second back iron extending in a first direction;
a first plurality of magnetized poles arranged with alternating polarity to each other in the first direction, wherein the first plurality of magnetized poles are coupled to the first back iron;

a second plurality of magnetized poles arranged with alternating polarity to each other in the first direction, wherein the second plurality of magnetized poles are coupled to the second back iron and wherein the second plurality of magnetized poles are arranged opposite to the first plurality of magnetized poles;

a coil disposed within a gap between the first plurality of magnetized poles and the second plurality of magnetized poles;

a first shield comprising a first part and a second part detached from the first part, wherein the first shield is disposed in a first leakage flux pathway and is separated from the first plurality of magnetized poles and the first back iron; and a second shield comprising a third part and a fourth part detached from the third part, wherein the second shield is disposed in a second leakage flux pathway and is separated from the second plurality of magnetized poles and the second back iron, wherein the first back iron is located between the first part and the second part, the second back iron is located between the third part and the fourth part, and the third and the fourth parts of the second shield are detached from the first and second parts of the first shield.

2. The method of claim 1, wherein the coil comprises at least one of a coil plate, a planar coil, and a member of a group of separated individual coils.

3. The method of claim 1, wherein the first shield is separated from the first plurality of magnetized poles and from the first back iron by at least one of air, vacuum, epoxy, high reluctance material, and diamagnetic material.

4. The method of claim 1, wherein the second shield is separated from the second plurality of magnetized poles and from the second back iron by at least one of air, vacuum, epoxy, high reluctance material, and diamagnetic material.

5. The method of claim 1, wherein the first and second shields each comprise a first and a second element, wherein the first elements of the first and second shields are configured to provide shielding in the first direction and have fixed positions with their respective back irons, and the second elements of the first and second shields are configured to provide shielding in a direction transverse to the first direction.

6. The method of claim 1, wherein the first shield and the second shield are end-caps.

7. A lithographic system, comprising:
an illumination system configured to produce a beam of radiation;
a support device configured to support a patterning device that is capable of patterning the beam of radiation;
a substrate stage configured to support a substrate; and
a projection system configured to project a patterned beam toward the substrate stage;
wherein the substrate stage has a linear motor, the linear motor comprising:
a first back iron and a second back iron extending in a first direction;
a first plurality of magnetized poles arranged with alternating polarity to each other in the first direction, wherein the first plurality of magnetized poles are coupled to the first back iron;
a second plurality of magnetized poles arranged with alternating polarity to each other in the first direction, wherein the second plurality of magnetized poles are coupled to the second back iron and wherein the second plurality of magnetized poles are arranged opposite to the first plurality of magnetized poles;

a coil disposed within a gap between the first plurality of magnetized poles and the second plurality of magnetized poles;

a first shield comprising a first part and a second part detached from the first part, wherein the first shield is disposed in a first leakage flux pathway and is separated from the first plurality of magnetized poles and the first back iron; and a second shield comprising a third part and a fourth part detached from the third part, wherein the second shield is disposed in a second leakage flux pathway and is separated from the second plurality of magnetized poles and the second back iron, wherein the first back iron is located between the first part and the second part, the second back iron is located between the third part and the fourth part, and the third and the fourth parts of the second shield are detached from the first and second parts of the first shield.

8. The lithographic system of claim 7, wherein the coil comprises at least one of a coil plate, a planar coil, and a member of a group of separated individual coils.

9. The lithographic system of claim 7, wherein the first shield is separated from the first plurality of magnetized poles and from the first back iron by at least one of air, vacuum, epoxy, high reluctance material, and diamagnetic material.

10. The lithographic system of claim 7, wherein the second shield is separated from the second plurality of magnetized poles and from the second back iron by at least one of air, vacuum, epoxy, high reluctance material, and diamagnetic material.

11. The lithographic system of claim 7, wherein the first and second shields each comprise a first and a second element, wherein the elements of the first and second shields are configured to provide shielding in the first direction and have fixed positions with their respective back irons, and the second elements of the first and second shields are configured to provide shielding in a direction transverse to the first direction.

12. The lithographic system of claim 7, wherein the first shield and the second shield are end-caps.

13. A lithographic system, comprising:
an illumination system configured to produce a beam of radiation;
a support device configured to support a patterning device;
a substrate stage configured to support a substrate; and
a projection system configured to project a patterned beam toward the substrate stage;
wherein the support device has a linear motor, the linear motor comprising:
a first back iron and a second back iron extending in a first direction;
a first plurality of magnetized poles arranged with alternating polarity to each other in the first direction, wherein the first plurality of magnetized poles are coupled to the first back iron;
a second plurality of magnetized poles arranged with alternating polarity to each other in the first direction, wherein the second plurality of magnetized poles are coupled to the second back iron and wherein the second plurality of magnetized poles are arranged opposite to the first plurality of magnetized poles;
a coil disposed within a gap between the first plurality of magnetized poles and the second plurality of magnetized poles;
a first shield comprising a first part and a second part detached from the first part, wherein the first shield is disposed in a first leakage flux pathway and is separated from the first plurality of magnetized poles and the first back iron; and a second shield comprising a third part and a fourth part detached from the third part, wherein the second shield is disposed in a second leakage flux pathway and is separated from the second plurality of magnetized poles and the second back iron, wherein the first back iron is located between the first part and the second part, the second back iron is located between the third part and the fourth part, and the third and the fourth parts of the second shield are detached from the first and second parts of the first shield.

14. The lithographic system of claim 13, wherein the coil comprises at least one of a coil plate, a planar coil, and a member of a group of separated individual coils.

15. The lithographic system of claim 13, wherein the first shield is separated from the first plurality of magnetized poles and from the first back iron by at least one of air, vacuum, epoxy, high reluctance material, and diamagnetic material.

16. The lithographic system of claim 13, wherein the second shield is separated from the second plurality of magnetized poles and from the second back iron by at least one of air, vacuum, epoxy, high reluctance material, and diamagnetic material.

17. The lithographic system of claim 13, wherein the first and second shields each comprise a first and a second element, wherein the first elements of the first and second shields are configured to provide shielding in the first direction and have fixed positions with their respective back irons, and the second elements of the first and second shields are configured to provide shielding in a direction transverse to the first direction.

18. The lithographic system of claim 13, wherein the first shield and the second shield are end-caps.

19. A lithographic system, comprising:
an illumination system configured to produce a beam of radiation;
a support device configured to support a patterning device that is capable of patterning the beam of radiation;
a substrate stage configured to support a substrate; and
a projection system configured to project a patterned beam toward the substrate stage;
wherein the support device and the substrate stage each has a linear motor, each linear motor comprising:
a first back iron and a second back iron extending in a first direction;
a first plurality of magnetized poles arranged with alternating polarity to each other in the first direction, wherein the first plurality of magnetized poles are coupled to the first back iron;
a second plurality of magnetized poles arranged with alternating polarity to each other in the first direction, wherein the second plurality of magnetized poles are coupled to the second back iron and wherein the second plurality of magnetized poles are arranged opposite to the first plurality of magnetized poles;
a coil disposed within a gap between the first plurality of magnetized poles and the second plurality of magnetized poles;
a first shield comprising a first part and a second part detached from the first part, wherein the first shield is disposed in a first leakage flux pathway and is separated from the first plurality of magnetized poles and the first back iron; and
a second shield comprising a third part and a fourth part detached from the third part, wherein the second shield is disposed in a second leakage flux pathway and is separated from the second plurality of magnetized poles and the second back iron,
wherein the first back iron is located between the first part and the second part, the second back iron is located between the third part and the fourth part, and the third and the fourth parts of the second shield are detached from the first and second parts of the first shield.

20. The lithographic system of claim 19, wherein the coil comprises at least one of a coil plate, a planar coil, and a member of a group of separated individual coils.

21. The lithographic system of claim 19, wherein the second shield is separated from the second plurality of magnetized poles and from the second back iron by at least one of air, vacuum, epoxy, high reluctance material, and diamagnetic material.

22. The lithographic system of claim 19, wherein the second shield is separated from the second plurality of magnetized poles and from the second back iron by at least one of air, vacuum, epoxy, high reluctance material, and diamagnetic material.

23. The lithographic system of claim 19, wherein the first and second shields each comprise a first and a second element, wherein the first elements of the first and second shields are configured to provide shielding in the first direction have fixed positions with their respective back irons, and the second elements of the first and second shields are configured to provide shielding in a direction transverse to the first direction.

24. The lithographic system of claim 19, wherein the first shield and the second shield are end-caps.

* * * * *